(12) United States Patent
Pepper

(10) Patent No.: US 6,999,891 B2
(45) Date of Patent: Feb. 14, 2006

(54) INDEPENDENT DESKEW LANE

(75) Inventor: Gerald Pepper, Thousand Oaks, CA (US)

(73) Assignee: IXIA, Calabasas, CA (US)

( * ) Notice: Subject to any disclaimer, the term of this patent is extended or adjusted under 35 U.S.C. 154(b) by 50 days.

(21) Appl. No.: 10/789,697

(22) Filed: Feb. 27, 2004

(65) Prior Publication Data

US 2005/0192772 A1 Sep. 1, 2005

(51) Int. Cl.
- G01M 19/00 (2006.01)
- H04L 7/02 (2006.01)
- H04J 3/06 (2006.01)
- G01R 31/28 (2006.01)

(52) U.S. Cl. .............. 702/122; 370/503; 370/508; 714/712

(58) Field of Classification Search ........... 702/62, 702/108, 122–123, 188; 370/244, 245, 249, 370/506, 508, 503; 710/305; 714/38, 47, 714/712; 709/236, 240; 375/372
See application file for complete search history.

(56) References Cited

U.S. PATENT DOCUMENTS

| | | | |
|---|---|---|---|
| 5,477,531 A | 12/1995 | McKee et al. | |
| 5,568,471 A | 10/1996 | Hershey et al. | |
| 5,905,713 A | 5/1999 | Anderson et al. | |
| 6,031,847 A * | 2/2000 | Collins et al. | 370/508 |
| 6,108,800 A | 8/2000 | Asawa | |
| 6,122,670 A | 9/2000 | Bennett et al. | |
| 6,173,333 B1 | 1/2001 | Jolitz et al. | |
| 6,233,256 B1 | 5/2001 | Dieterich et al. | |
| 6,279,124 B1 | 8/2001 | Brouwer et al. | |
| 6,336,192 B1 | 1/2002 | Sakamoto et al. | |
| 6,345,302 B1 | 2/2002 | Bennett et al. | |
| 6,557,110 B1 | 4/2003 | Sakamoto et al. | |
| 2003/0043434 A1 | 3/2003 | Brachmann et al. | |
| 2003/0219040 A1 | 11/2003 | Kim | |
| 2004/0177291 A1 * | 9/2004 | Goyal et al. | 714/712 |

OTHER PUBLICATIONS

PacBERT Bit Error %Rate Test (BERT) Test Application; Dec. 2001; Spirent Communcations.

Verification of Skew and Jitter Tolerance and Compensationin High-Speed Interfaces by Alex Genuson and Steve Callahan of Zaiq Technologies; Design & Verification Conference & Exhibition (DVCon), San Jose, CA, 2003 (Jan. 22, 2003).

Serdes Framer Interface Level 5 (SFI-5): Implementation Agreement for 4-Gb/s Interface for Physical Layer Devices (Optical Internetworking Forum OIF-SF15-01.0) by Peter Dartnell, Mike Lerer, Jeffrey Lynch; Jan. 29, 2002.

* cited by examiner

Primary Examiner—Michael Nghiem
Assistant Examiner—John Le
(74) Attorney, Agent, or Firm—SoCal IP Law Group LLP; Mark Andrew Goldstein; Steven C. Sereboff

(57) ABSTRACT

There is disclosed an independent deskew lane. An independent deskew lane may be implemented in a testing system to test whether a device under test conforms to a physical layer communications standard. The testing system may have lane cards to transmit data on data lanes to the device under test and receive data from the device under test. A deskew card is also included in the testing system. The deskew card may prepare deskew information independent of the lane cards. The deskew card may have a transmitter circuit and a receiver circuit included therein which implements the independent deskew lane. A computer may be coupled to the testing system. Test patterns may be provided to the lane cards and the deskew card from the computer.

21 Claims, 6 Drawing Sheets

INDEPENDENT DESKEW LANE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

BACKGROUND

1. Field of the Invention

The present invention relates to high speed data communications.

2. Related Art

High speed data communications over optical links is governed by various standards. One of the standards is the *Serdes Framer Interface Level 5 (SFI-5): Implementation Agreement for 40 Gb/s Interface for Physical Layer Devices* promulgated by the Optical Internetworking Forum of Fremont, Calif. Serdes refers to SERialization and DESerialization. This standard, referred to herein as the SFI-5 standard, specifies the physical layer requirement for communications at 40 gigabits per second (Gb/s). The SFI-5 standard defines the interface between a Serdes component, a forward error correction unit, and a framer. The SFI-5 standard specifies 16 bit wide data bus, that is, a data bus with 16 data lanes. A deskew lane is also specified as a seventeenth lane.

The data signals may encounter different delays in transit from the SFI-5 source device to the sink device. The earliest arriving signal may lead the latest arriving by n bits. Relative to the earliest, each of the remaining signals is coincident, or is up to n unit intervals late. The search space for determining the relative delays of all 17 signals on SFI-5 is $(n+1)^{17}$ combinations. The deskew lane serves as a reference lane to allow each of the 16 data lanes to independently measure its own delay relative to the reference signal.

The deskew function is shared between the SFI-5 source and sink devices at either end of receive and transmit interfaces. In a source device, data is sampled from each of the 16 data lanes sequentially, and copied onto the deskew lane. The deskew lane is then sent with the 16 data lanes to the sink device over the SFI-5 interface. Data input to the sink device may be skewed by the different delays in each of the data lanes. It is the function of a deskew algorithm operating in the sink device to measure the amount of skew on each data channel, and then to use this skew information to compensate for the amount of skew. The deskew algorithm may make an initial skew measurement on initial power up or connection. Subsequent to skew measurement, external conditions may vary causing the skews to change. SFI-5 compliant devices track skew changes without introducing data or transmission errors. The deskew algorithm may operate continuously during normal operation of an SFI-5 interface to continuously track skew.

Testing systems may be used to verify whether systems, devices and apparatuses conform to the SFI-5 standard and to evaluate whether SFI-5 compliant systems, devices and apparatuses can handle anticipated or large loads of network traffic.

THE DRAWINGS

DETAILED DESCRIPTION

Throughout this description, the embodiments and examples shown should be considered as exemplars, rather than limitations on the apparatus and methods of the present invention.

A System

Figure 1:
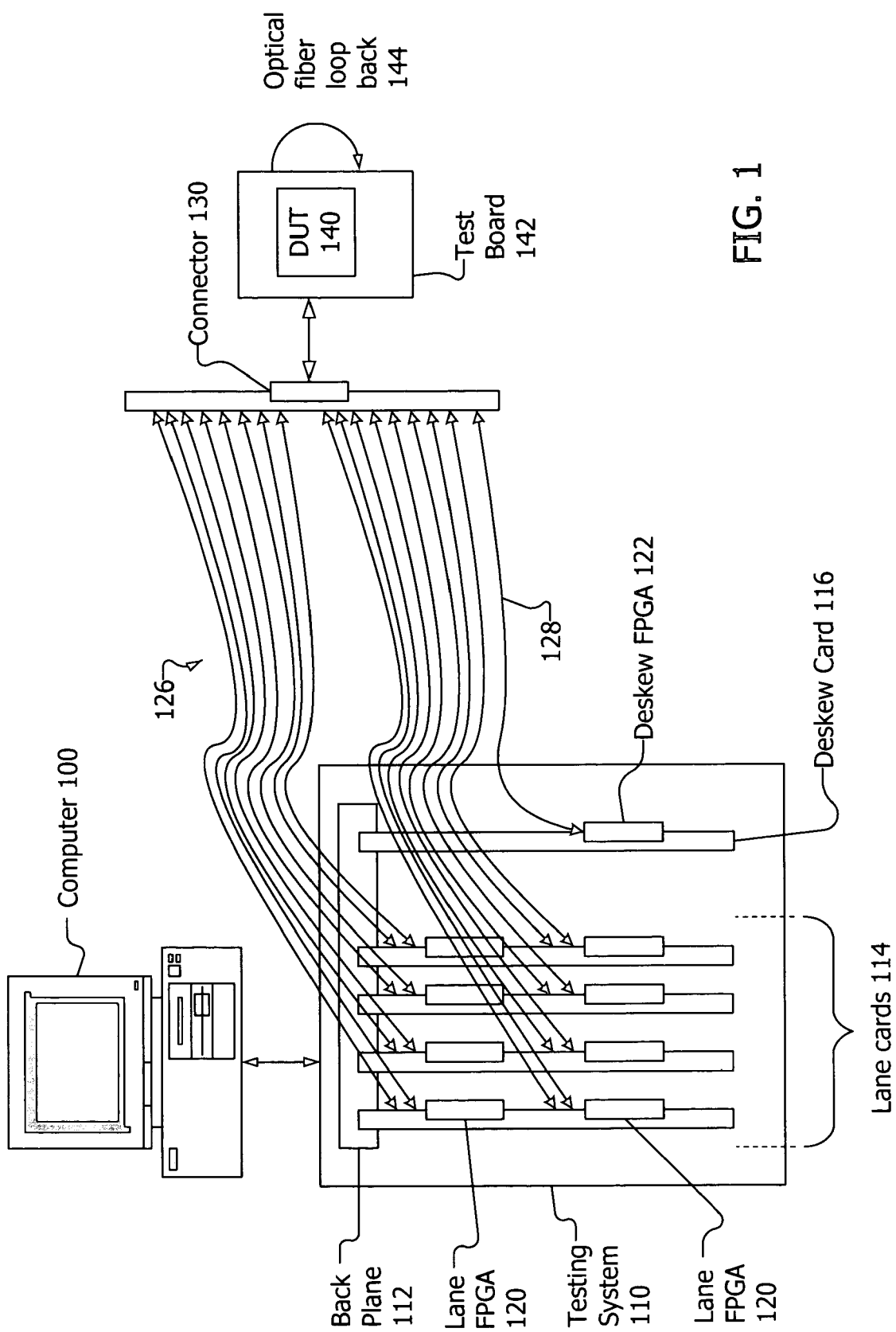
FIG. 1 is a block diagram of an environment in which an independent deskew lane may be practiced.

FIG. 1 is a block diagram of an environment in which an independent deskew lane may be practiced. A testing system 110 may be coupled with a device under test (DUT) or a system under test (SUT). The DUT/SUT may be an optical communications unit, a communications equipment component, including boards or cards having computer chips, and communications chips, or a combination of these, all of may support a communications standard, and, more specifically, an optical communications standard. As shown, DUT 140 is a computer chip which is located on a test board 142. The DUT 140 may be coupled to the testing system 110 via connector 130. The DUT 140 may provide support for and conform to the SFI-5 standard, other physical layer optical communications standard, or other physical (PHY) layer communications standard. The test board 142 may include an optical fiber loop back 144. As shown, the DUT 140 may be a computer chip such as, for example, a field programmable gate array (FPGA), an application specific integrated circuit (ASIC), an electrically erasable programmable memory (EEPROM) chip, a programmable logic array (PLA), a programmable logic device (PLD), and others.

The testing system 110 may be used to test whether the DUT 140 or other DUT or SUT conforms to a PHY layer optical communications standard such as SFI-5 or a PHY layer communications standard. The testing system 110 may be a bit error rate testing (BERT) system. The testing system 110 may provide for 16 data lanes 126 and one deskew lane 128 as required by the SFI-5 specification. The data and deskew lanes may be included in a single cable and as 17 separate cables. The testing system 110 may operate to test DUTs at 10 Gbps, 40 Gbps, and slower and faster. In one embodiment, each data lane 126 operates at 2.5 Gbps. Other data lane speeds may be used to achieve a desired overall speed.

BERT systems typically generate Pseudo Random Bit-Streams (PRBS) to evaluate DUTs. A PRBS may have $2^7$, $2^9$, $2^{11}$, $2^{31}$ and other bitstreams. BERT systems may also generate Pseudo Random Word Sequences (PRWS). As test patterns, which may be in the form of bitstreams and word sequences, increase in size, the overhead incurred in maintaining deskew or synchronization information for the test pattern increases in the form of processing requirements and memory requirements increases.

In traditional systems, deskew data for outgoing data is prepared along with the outgoing data such that the preparation of outgoing data and outgoing deskew information are integrated. If a memory-based independent deskew lane is used in which deskew data is stored in and retrieved from a memory, the test pattern size or length is limited by the size of the memory. As set forth herein, deskew data is achieved independently of the preparation of outgoing transmission data and is generated on the fly according to pattern definitions. Similarly, when received data is evaluated, the preparation of deskew information is achieved independently from the processing of received data and on the fly according to pattern definitions.

The testing system 110 may include software and hardware for providing the functionality and features of the invention. The hardware and firmware components of the testing system 110 may include various specialized units, circuits, software and interfaces for providing the functionality and features of the invention.

The testing system 110 may include a back plane 112 to which lane cards 114 and a deskew card 116 are coupled. In one embodiment, there is a single FPGA per data lane and an FPGA for the deskew lane. By allocating an FPGA per lane, independent test patterns may be used per lane. Further, by allocating an FPGA per lane, arbitrarily long test patterns may be used without limitation. The use of independent test patterns per lane and arbitrarily long test patterns provides for improved testing and evaluation of DUTs by allowing for more robust testing of DUTs, such as testing for a greater number of test scenarios and testing with a larger amount of data than is available in traditional systems.

FPGAs 120 and 122 may be included on the lane cards 114 and the deskew card 116. In one embodiment, there are four lane cards 114 and one deskew card 116. In this embodiment, each lane card 114 includes two lane FPGAs 120, each lane card 114 supports four data lanes 126, and each lane FPGA 120 may support two data lanes 126. Other embodiments may have more or fewer lane FPGAs on more or fewer lane cards, and each lane FPGA may support 1, 2, 3, 4 or more lanes. The more lane FPGAs per lane card, the fewer lane cards are needed to provide the 16 data lanes required by SFI-5. The lane cards 114 each operate in a synchronized interleaved fashion in coordination with the deskew card 116 to transmit data over lines 126.

The deskew card 116 transmits information on the deskew lane 128 that is used to synchronize and align the information the lane cards 114 transmit on the data lanes 126. The deskew card 116 may comprise a deskew FPGA 122 and a processor. The deskew card 116 may support a single deskew lane 128. The deskew card 116 independently creates deskew information, also known as synchronization information, without any communication with the lane cards 114 or monitoring of the lane data on the data lanes 126. The deskew card 116 may also include random access memory (RAM), a read-only memory (ROM), programmable read-only memory (PROM), EEPROM or other storage media on which pattern definitions, such as definitions for PRBS patterns, may be stored. In one embodiment, the deskew FPGA 122 includes a RAM block and a ROM block. In another embodiment, the deskew FPGA 122 is coupled to a ROM to access the PRBS pattern definitions or other pattern information. The test pattern definitions may be transferred to the deskew card 116 from a storage medium external to the testing system 110, such as from computer 100, and stored in the deskew FPGA 122 or RAM included on deskew card 116.

In other implementations, the FPGAs 120 and 122 may be replaced with other silicon devices (e.g., ASICs, PLAs, PLDs, and others). The FPGAs 120 and 122 may also be replaced with software that executes on a microprocessor.

The computer 100, which may be, for example, a personal computer, may be coupled to the testing system 110. In one embodiment in which the lane cards 114 and deskew card 116 of testing system 110 include FPGAs or other programmable components, the computer 100 transfers software, object code, and/or other instructions, etc. to the FPGAs or other programmable components on the lane cards 114 and the deskew card 116. This transfer may occur regularly on startup of testing system 110, or only when a new version of the software is provided to computer 100. The software or other instructions may be stored on a hard disk included in the computer 100. The software or other instructions may be available over a network from a local or remote source, such as, for example, a server computer or external disk drive to computer 100 and/or to the testing system 110.

Software executed in the computer 100 may provide a management user interface to allow a user to access the testing system 110. This access may include monitoring and controlling the testing system 110. The management user interface may be used to start and stop testing, designate system-defined test patterns for each lane, and notify the deskew card 116 which testing pattern is loaded in each lane or lane card 114. The system-defined test patterns may be a PRBS, PRWS, or other test pattern. The software that provides the management user interface may be stored on and executed from a hard disk drive or other storage device included in or coupled to the computer 100.

The techniques discussed herein may be implemented with any storage media in any storage device included with or otherwise coupled or attached to the computer 100. These storage media include, for example, magnetic media such as hard disks, floppy disks and tape; optical media such as compact disks (CD-ROM and CD-RW) and digital versatile disks (DVD and DVD±RW); solid state memory such as flash memory; and any other storage media. As used herein, a storage device is a device that allows for reading and/or writing to a storage medium. Storage devices include, hard disk drives, DVD drives, flash memory devices, microdrives, minidrives, and others.

Additional and fewer units, modules or other arrangement of software, hardware and other components may be used to achieve the testing system described herein.

Figure 2:
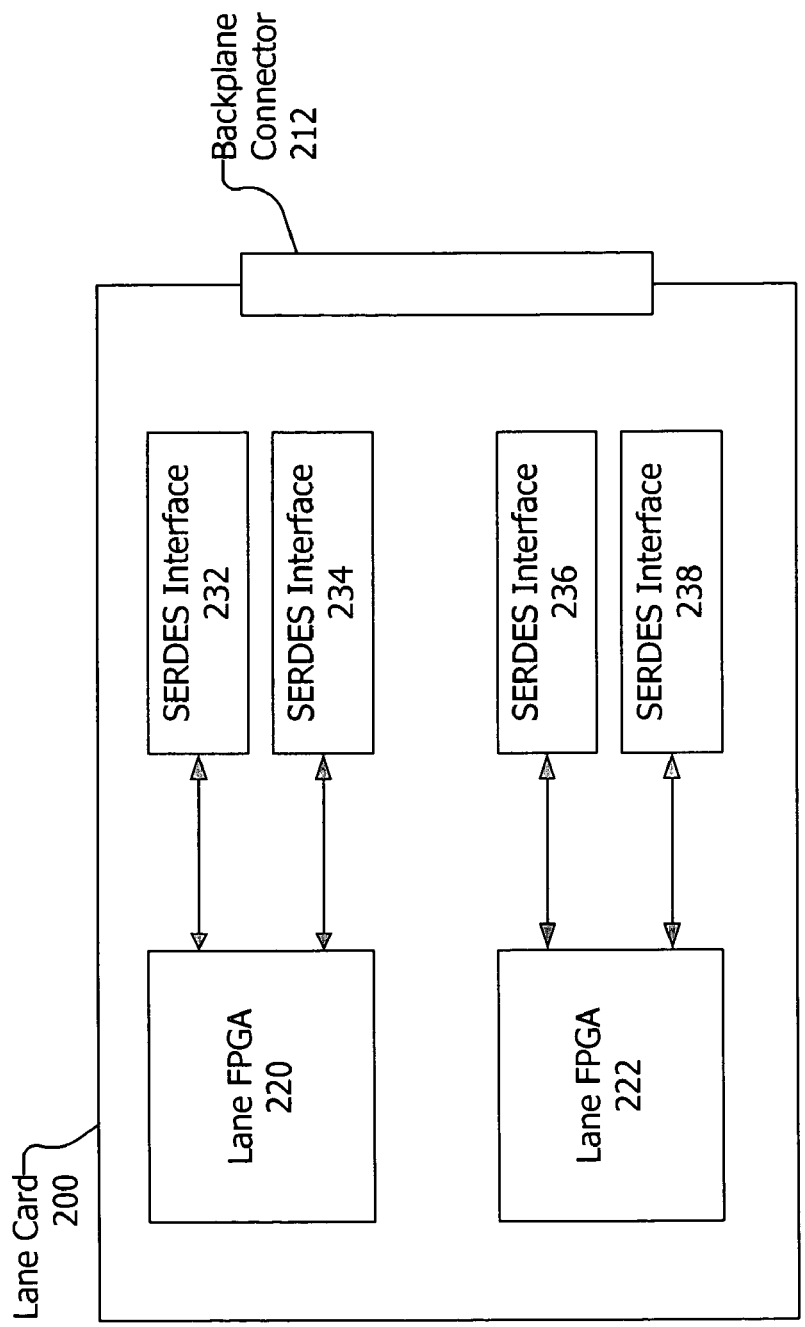
FIG. 2 is a block diagram of a lane card.

FIG. 2 is a block diagram of a lane card 200 that may be included in a testing system, such that the lane card 200 may be used as the lane card 114 of the testing system 110 of FIG. 1. The lane card 200 may comprise a backplane connector 212 and two lane FPGAs 220 and 222. Each lane FPGA 220 and 222 may be coupled to two SERDES interfaces. That is, one lane FPGA 220 may be coupled with the SERDES interfaces 232 and 234, and the other lane FPGA 222 may be coupled with SERDES interfaces 236 and 238. It is via the SERDES interfaces 232, 234, 236 and 238 that the lane FPGAs 220 and 222 communicate with a DUT or SUT. Each of the SERDES interfaces 232, 234, 236 and 238 may operate at 2.5 Gbps. Other speeds may be used to achieve a desired overall speed for the lane card 200 or for each of the lane FPGAs 220 and 222.

A backplane connector 212 may be used to couple lane card 200 within a testing system. The backplane connector 212 may be used for receipt of electrical power and/or for transmission of and receipt of data. The lane card 200 may receive test patterns and other information over the backplane connector 212 from a computer coupled to a testing system in which the lane card is coupled. The lane card 200 may store test patterns in FPGAs 220 and 222 and/or in RAM and ROM (not shown) which may be included on the lane card 200.

Figure 3:
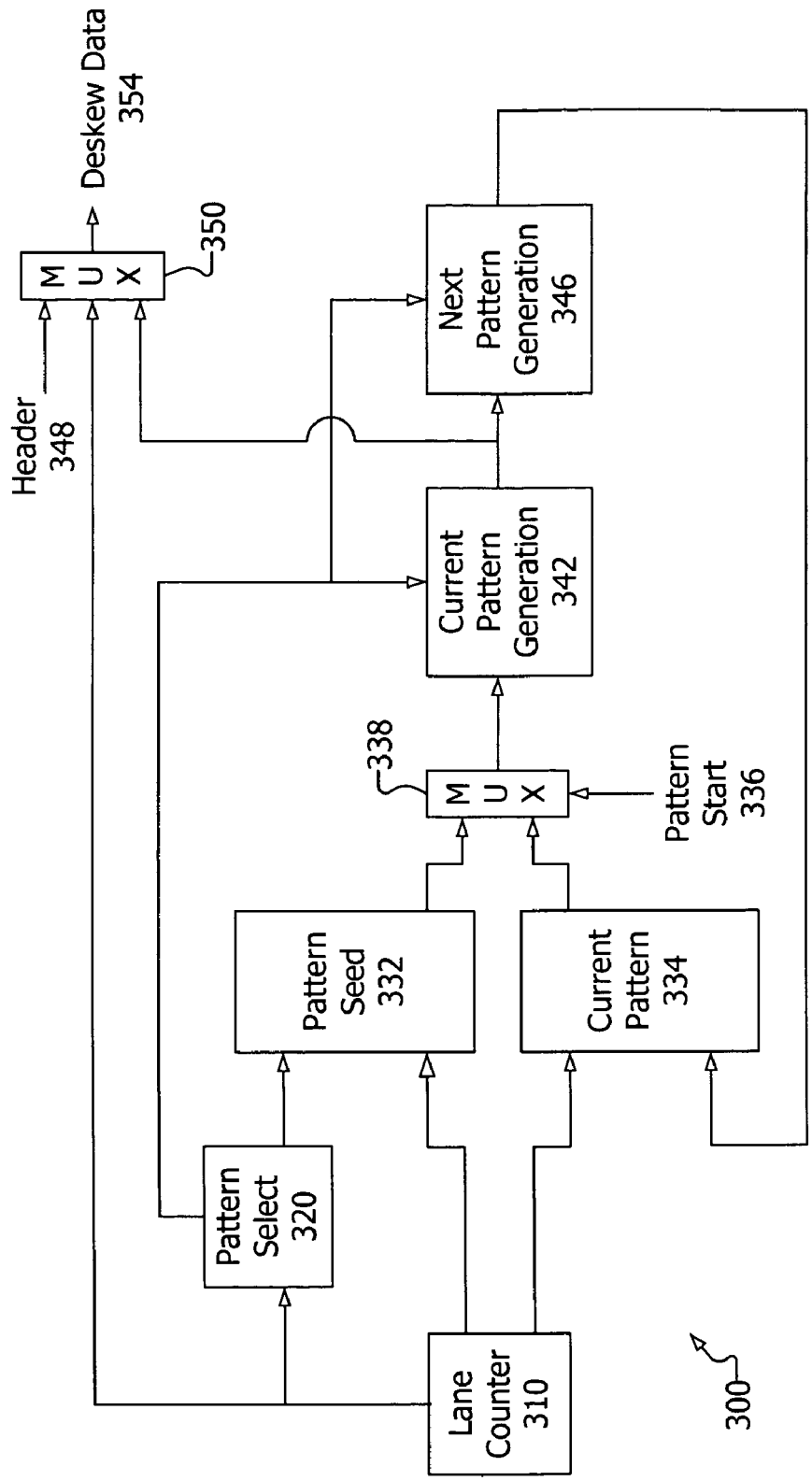
FIG. 3 is a block diagram of transmitter circuit in which an independent deskew lane may be practiced.

FIG. 3 is a block diagram of an embodiment of a transmitter circuit 300 for implementing an independent deskew lane. The transmitter circuit 300 may be implemented on an FPGA which may be included on a deskew card, such as deskew card 116. The FPGA may have a pre-loaded RAM block which serves as a ROM. The FPGA may also have a RAM block included therein.

A lane counter 310 is coupled to and provides input to a pattern select unit 320, a pattern seed unit 332, and a current pattern unit 334. The lane counter 310 increments from 1 through 17 or 0 through 16, and designates for which lane the transmitter is providing deskew data, or whether deskew or other data is being transmitted.

The pattern select 320 is coupled to and provides input to the pattern seed unit 332, the current pattern generation unit 342, and a next pattern generation unit 346. The pattern select unit 320 outputs a signal that specifies or identifies which pattern is to be transmitted on the lane specified by the lane counter 310. The pattern select unit 320 may be a preloaded RAM block in an FPGA that serves as a ROM, holding a system-defined test pattern definition. The pattern definition or pattern definitions stored in the pattern select unit 320 may be received in response to a user command provided via a management interface to a testing system. That is, in one embodiment, a user selects from a system-defined group of test patterns to be used for testing.

The pattern seed unit 332 may provide a system-defined number of pattern definitions for each of the 16 data lanes. For example, a testing unit may provide a user the ability to test using system-defined number of test patterns which may be provided by a manufacturer and downloaded to the FPGA on startup.

The current pattern unit 334 provides the current state for the 16 data lanes. The current state may be based on the value output by the lane counter 310 and derived from the next pattern generation unit 346, described below. The current state may provide the current pattern definition for each of the data lanes. That the current pattern unit 334 receives input from the next pattern generation unit 346 provides for forward error correction.

The pattern seed data unit 332 and the current pattern unit 334 are coupled to and provide information to a mux 338. The mux 338 receives a pattern start signal 336. The pattern start signal 336 may be generated in response to a user command to begin testing. The mux 338 receives a pattern seed from the pattern seed unit 332 and a current pattern from the current pattern unit 334. The mux 338 selects between the pattern seed 332 and the current patter based on the pattern start signal 336. If the testing system is powering on and being used for an initial test, the pattern seed from the pattern seed unit 332 is selected. When the testing unit has already been started, there will be no pattern start signal 336; in one implementation in which the pattern start signal 336 is a Boolean value, the signal is set to false in this circumstance. When the testing unit is not in pattern start mode, the current pattern from the current pattern unit 334 is selected by the mux 338.

A current pattern generation unit 342 generates a current pattern based on the pattern select signal 320 and input from the mux 338. That is, the current pattern generation unit 342 generates a current pattern based on the pattern seed from the pattern seed unit 332 or the current pattern from the current pattern unit 334. The current pattern generated from the current pattern generation unit 342 is provided to the next pattern generation unit 346. The current pattern generation unit 342 is coupled to and provides input to a mux 350 and a next pattern generation unit 346.

The next pattern generation unit 346 provides the next pattern to be generated to the current pattern unit 334. The next pattern generation unit 346 generates the pattern that will be used after the current pattern has completed. The amount of data that is transmitted per pattern for all lanes may be 17*64 bits; that is, the total umber of lanes, both data and deskew, with 64 bits per lanes, for a total of 1,088 bits.

The transmitter circuit 300 outputs deskew data 354. The deskew data 354 is compiled by the mux 350. The mux 350 receives input from the lane counter 310, and uses the lane information received from the lane counter 310 to select between outputting a header 348 and the output of the current pattern generation unit 334, the current pattern. The mux 350 transmits the header 348 when the lane counter designates the lane that corresponds to the deskew lane, and transmits the current pattern when the lane counter designates a lane that is a data lane.

The header 348 provides deskew information, and may be, according to the SFI-5 standard, a 64 bit data item. The header 348 or a portion thereof may be stored in an FPGA and provided during start up of a testing system from a computer attached to the testing system in which the transmitter circuit is included.

Figure 4:
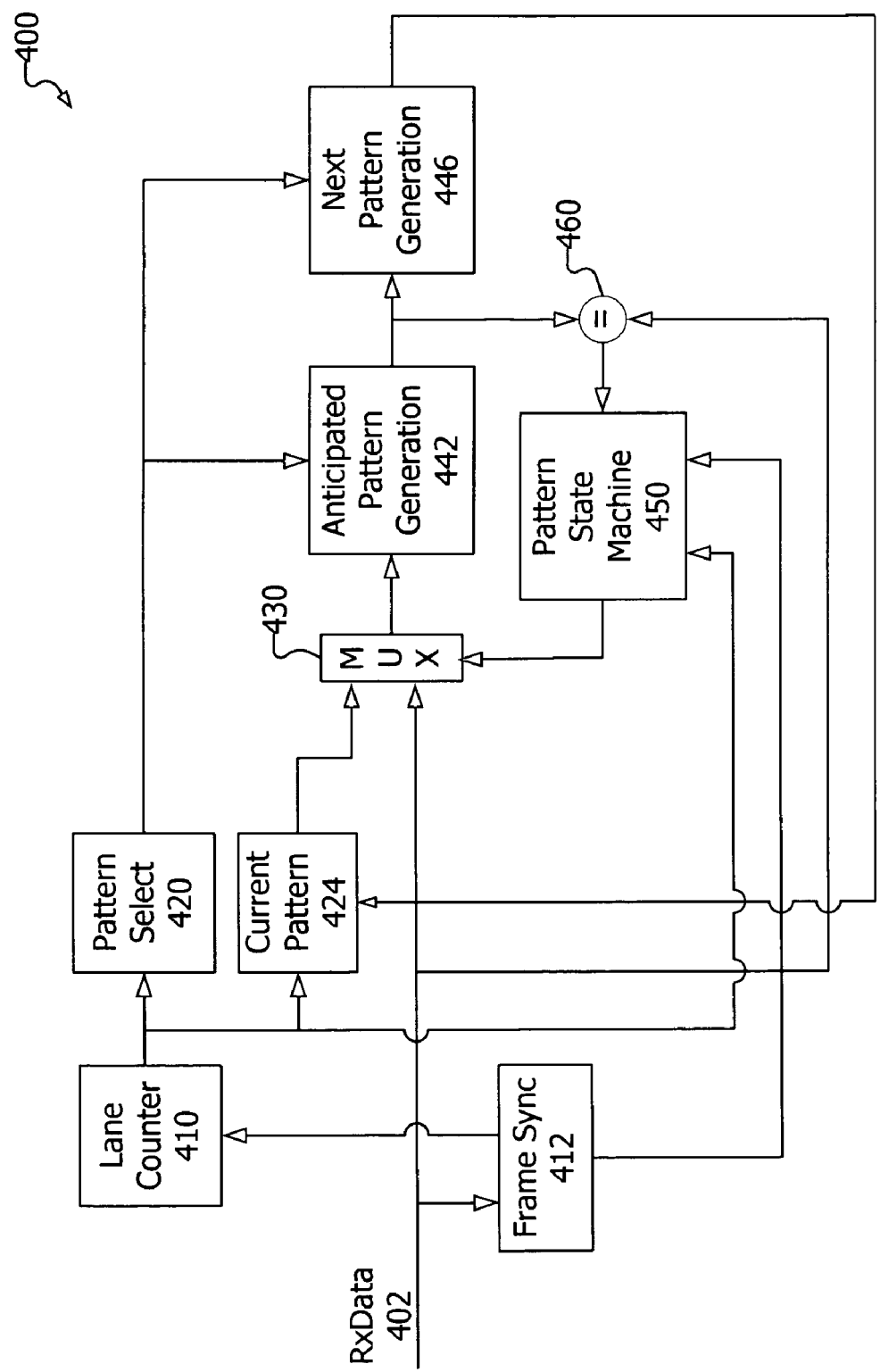
FIG. 4 is a block diagram of receiver circuit in which an independent deskew lane may be practiced.

FIG. 4 is a block diagram of an embodiment of a receiver circuit 400 for implementing an independent deskew lane. The receiver circuit 400 may be implemented on an FPGA and included on a deskew card such as deskew card 116. The FPGA may designate internal portions for use as RAM and ROM, and/or may be coupled to RAM and ROM external to the FPGA.

The receiver circuit 400 may be included on the same deskew card as a transmitter circuit, such as the transmitter circuit 300 shown in FIG. 3. The receiver circuit 400 and the transmitter circuit 300 may be included in a single FPGA. The receiver circuit 400 and the transmitter circuit 300 may be included on separate FPGAs on separate deskew cards. The receiver circuit 400 and the transmitter circuit 300 may also be incorporated on other silicon devices and chips such as ASICs, PLAs, PLDs, and others.

Received data, RxData 402, is input on a line and provided to a mux 430, a frame synchronization (sync) unit 412, and a compare unit 460.

The frame sync unit 412 identifies where data is located in the RxData 402. The frame sync unit may locate where data is located based on the size of a header expected to be prepended to the RxData 402. The header which the frame sync unit 412 seeks may be 64 bits and may conform to the SFI-5 standard. The frame sync unit 412 is coupled to and provides information to a pattern state machine 450 and a lane counter 410.

When the frame sync unit 412 identifies the data location, the frame sync unit 412 enables the pattern state machine 450 and may send the pattern state machine 450 an enable signal and/or information about where the pertinent data is located in the RxData 402.

When the location of the data in the RxData 402 is found, the frame sync unit 412 resets the lane counter 410 based on the starting point of the data in the RxData 402.

The lane counter 410 is coupled to and provides a current lane designation to the pattern select unit 420, the current pattern unit 424, and the pattern state machine 450.

Based on the lane specified by the lane counter 410, (a) the pattern select 420 looks up or otherwise provides a pattern to be used for the specified lane, (b) the current pattern unit 424 provides the data expected to be included in the RxData 402 to the mux 430, and (c) the pattern state machine 450 selects between performing testing or searching for data in the RxData 402. That is, the mux 430 selects between the RxData 402 and the current pattern from the current pattern unit 424.

The current pattern unit 424 may be a RAM block within an FPGA. The current pattern may include data required for 16 data lines. The current pattern unit 424 may receive input from the next pattern generation unit 446. That the current pattern unit 424 receives input from the next pattern generation unit 446 may provide for forward error correction.

The current pattern unit 424 may receive input from the lane counter 410 which designates over which lane the RxData 402 is being received. The lane counter 410 serves to select which lane of the current pattern data should be used.

The mux 430 passes either the current pattern 424 or the RxData 402 to the anticipated pattern generation unit 442.

The anticipated pattern generation unit 442 receives a pattern specification from the pattern select unit 420 and a pattern from the mux 430, either the current pattern from the current pattern unit 424 or the RxData 402. The anticipated pattern generation unit 442 generates an anticipated pattern based on the pattern received from the mux 430. The anticipated pattern generation unit 442 is coupled to and provides information to the next pattern generation unit 446 and the compare unit 460.

The next pattern generation unit 446 generates the next pattern based on input received from the pattern select unit 420 and the anticipated pattern received from the anticipated pattern generation unit 442.

The compare unit 460 compares the anticipated generated pattern output from the anticipated pattern generation unit 442 with the RxData 402. The compare unit 460 may provide a match/no match data item and the RxData 402 to the pattern state machine 450. If the comparison shows that the current generated pattern does not correspond with the received data, the device under test has failed to perform without error and/or in accordance with the communications standard being used, such as, for example, SFI-5.

The pattern state machine 450 receives a frame synchronization signal from the frame sync unit 412. The frame sync unit 412 enables the pattern state machine 450 to send information to mux 430. The pattern state machine 450 serves as a select of or control of the mux 430. The pattern state machine 450 may receive the results of the compare unit 460 in the form of match/no match data item and increment a local counter per lane. The pattern state machine 450 may evaluate whether the number of errors, the error density, is greater than a system-defined error threshold. When the number of errors is greater than the error threshold, the pattern state machine 450 transitions to/remains in a pattern acquisition state, and the mux 430 is instructed to select the RxData 402. When the number of errors is less than or equal to the error threshold, the pattern state machine 450 transitions to/remains in a pattern locked state, and the mux 430 is instructed to select the current pattern from the current pattern unit 424. That is, based on the signal or information provided by pattern state machine 450, the mux 430 selects between the current pattern from the current pattern unit 424 and the RxData 402.

A Method

Figure 5:
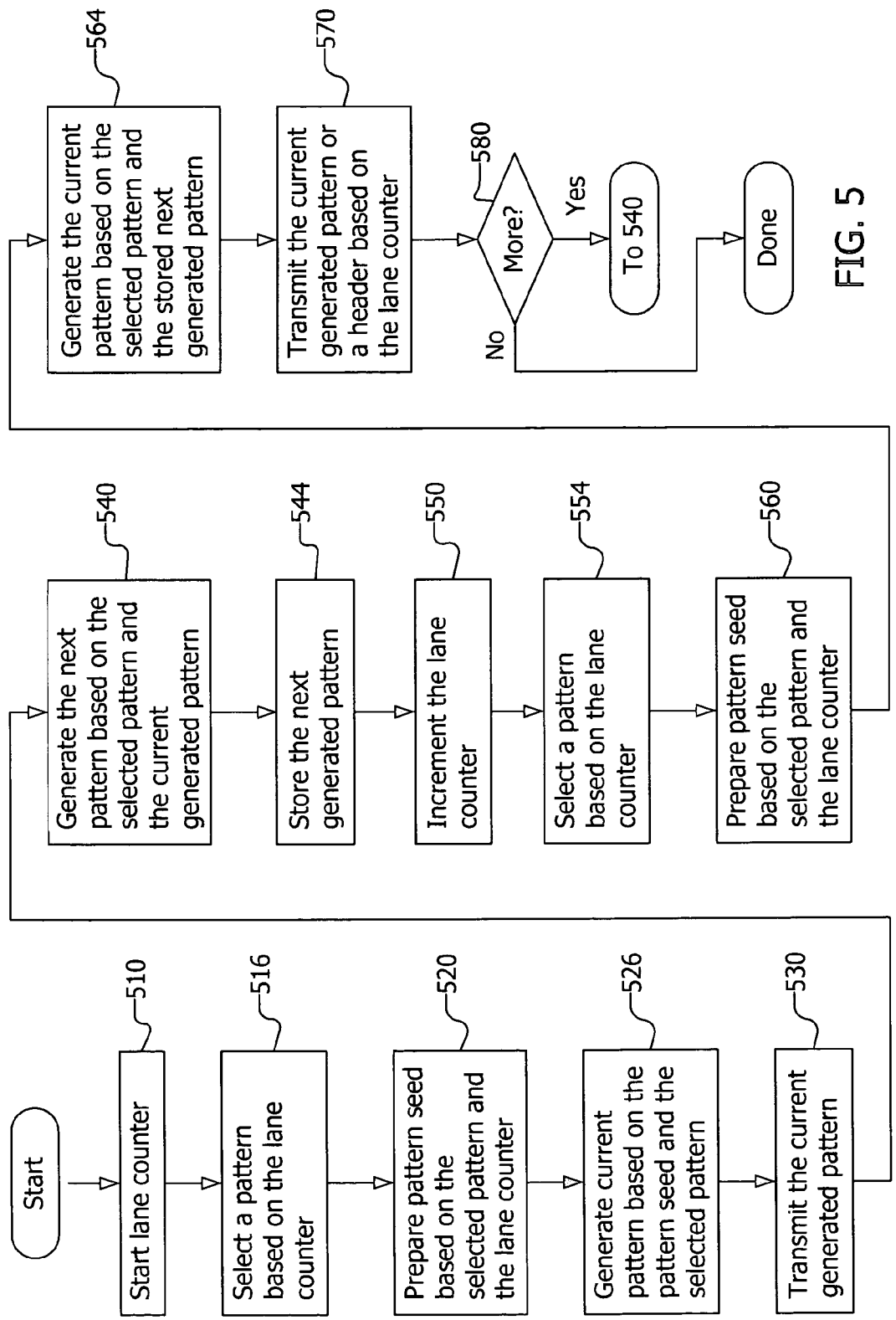
FIG. 5 is a flow chart of the actions taken when transmitting data using an independent deskew lane described herein.

FIG. 5 is a flow chart of the actions taken when transmitting data using an independent deskew lane described herein. A lane counter may be started, as shown in block 510. The lane counter may increment from, for example, 0 through 16. A pattern may be selected based on the value of the lane counter, as shown in block 516. The pattern may be a PRBS or other test pattern. A pattern seed is prepared based on the selected pattern and the lane counter, as shown in block 520. This preparation may be achieved by reading, loading or otherwise accessing a stored pattern seed. A current pattern is generated based on the pattern seed and the selected pattern, as shown in block 526. The current generated pattern is transmitted, as shown in block 530. The actions taken regarding blocks 510 through 530 are typically achieved the first time data is prepared for transmission.

The next pattern is generated based on the selected pattern and the current generated pattern, as shown in block 540. The next generated pattern is stored, as shown in block 544. The next generated pattern may be stored, for example, in a RAM or an a portion of an FPGA.

The lane counter is incremented, as shown in block 550. A pattern is selected based on the value of the lane counter, as shown in block 554. A seed pattern is prepared based on the selected pattern and the lane counter, as shown in block 560. The current pattern is generated based on the selected pattern and the stored next generated pattern, as shown in block 564. The current generated pattern or a header is transmitted, based on the value of the lane counter, as shown in block 570. When the value of the lane counter corresponds to a deskew lane, a header is sent; when the value of the lane counter corresponds to a data lane, the current generated pattern is transmitted.

A check may be made to determine whether there is more data in the form of test patterns to be transmitted, as shown in block 580. If there is more data to be transmitted, the flow of actions continues at block 540. If there is no further data to be transmitted, the flow of actions ceases.

Figure 6:
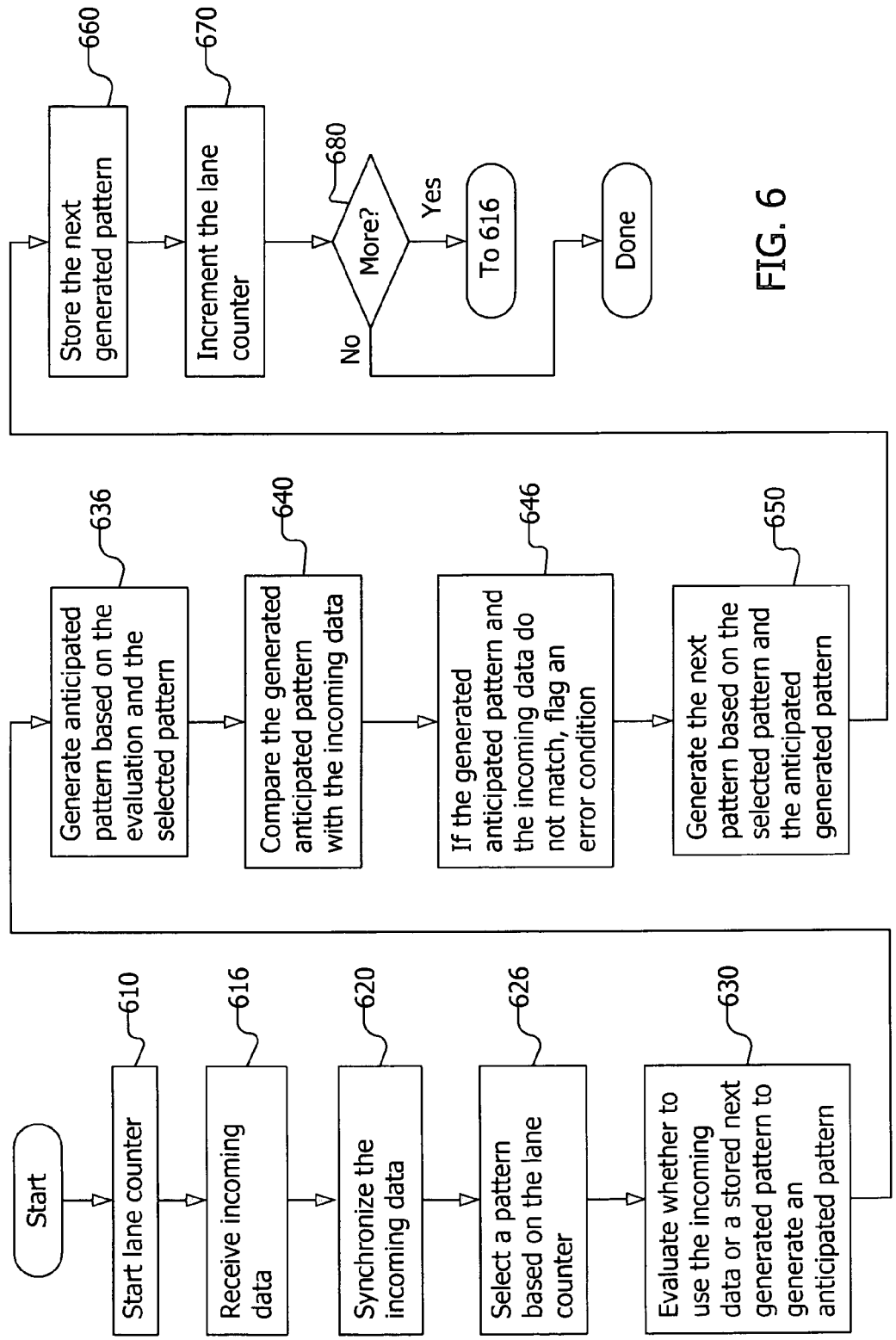
FIG. 6 is a flow chart of the actions taken when receiving data according using an independent deskew lane described herein.

FIG. 6 is a flow chart of the actions taken when receiving data according using an independent deskew lane described herein. The flow of actions shown in FIG. 6 may be implemented on an FPGA or other device or combination of components having a circuit like that described above regarding FIG. 4.

A lane counter is started, as shown in block 610. Incoming data is received, as shown in block 616. The incoming data is synchronized, as shown in block 620. This synchronization may be achieved by locating where pertinent data begins after a pre-pended header. A test pattern may be selected based on the value of the lane counter, as shown in block 626. An evaluation may be performed to determine whether to use the incoming data or a stored next generated pattern to generate an anticipated pattern, as shown in block 630. An anticipated pattern is generated based on the evaluation and the selected pattern, as shown in block 636. During the first time through this sequence of actions, there is no stored next generated pattern, so the incoming data is used.

The generated anticipated pattern is compared with the incoming data, as shown in block 640. If the generated anticipated pattern and the incoming data do not match an error condition exists and may be flagged, as shown in block 646. Error conditions may be stored, reported, communicated, logged or handled in a variety of ways. The error condition may be recognized by user interface management software and reported to a user.

The next pattern is generated based on the selected pattern and the anticipated generated pattern, as shown in block 650. The next generated pattern is stored, as shown in block 660. The lane counter is incremented, as shown in block 670.

A check may be made to determine whether there is more incoming data, either or both expected and actual, as shown in block 680. If there is more data, the flow of actions continues at block 616. If there is no further data to be transmitted, the flow of actions ceases.

With regard to FIGS. 5 and 6, additional and fewer steps may be taken, and the steps as shown may be combined or further refined to achieve the methods described herein. In addition, some or all of the steps may be achieved in an order other than that shown and/or concurrently.

Although exemplary embodiments of the invention have been shown and described, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

It is claimed:

1. A system to test whether a device under test conforms to a physical layer communications standard, the system comprising:
    a plurality of lane cards to transmit data on a plurality of data lanes to the device under test according to a test pattern and according to the physical layer communications standard;
    a deskew card to prepare deskew information according to the test pattern and independent of the lane cards according to the physical layer communications standard, the deskew card to evaluate incoming deskew information included with received incoming data independent of the lane cards according to the physical layer communications standard
    wherein the system generates arbitrarily long test data on the data lanes according to the test pattern.

2. The system of claim 1 wherein the test pattern is arbitrarily long.

3. The system of claim 1 wherein the deskew card is further to generate the test pattern independent of the data lanes.

4. The system of claim 1 wherein the number of data lanes is 16 and the physical layer communications standard is the Serdes Framer Interface Level 5 (SFI-5) standard.

5. The system of claim 1 wherein the lane cards each transmit data on two data lanes.

6. The system of claim 1 wherein the lane cards each include two lane Field Programmable Gate Arrays.

7. The system of claim 1 coupled to a computer that includes software which when executed provides a management user interface that allows a user to access the system.

8. A testing system to test whether a system under test conforms to a physical layer communications standard, the testing system comprising:
    a plurality of lane cards to transmit data on a plurality of data lanes to the system under test according to a test pattern and according to the physical layer communications standard, and to receive data on the plurality of data lanes from the system under test;
    a deskew card to prepare outgoing deskew information for outgoing data independent of the lane cards according to the test pattern and according to the physical layer communications standard, and to evaluate incoming deskew information included with received incoming data independent of the lane cards according to the physical layer communications standard
    wherein the system generates arbitrarily long test data on the data lanes according to the test pattern.

9. The testing system of claim 8 wherein the testing system generates test data according to the test pattern on each of the data lanes independent of the other data lanes.

10. The testing system of claim 8 wherein the number of data lanes is 16, and the physical layer communications standard is the Serdes Framer Interface Level 5 (SFI-5) standard.

11. The testing system of claim 8 wherein each lane card transmits data on two data lanes.

12. The testing system of claim 8 wherein each of the lane cards include two lane Field Programmable Gate Arrays.

13. The testing system of claim 8 having a computer coupled thereto.

14. The testing system of claim 13 wherein the computer includes software which when executed provides a management user interface that allows a user to monitor and control the testing system.

15. A method for transmitting test data according to a physical layer communications standard comprising:
    starting a lane counter;
    selecting a selected test pattern based on the lane counter;
    selecting a pattern seed based on the selecting and the lane counter;
    generating a current generated test pattern based on the pattern seed and the selected test seed;
    transmitting the current generated test pattern;
    generating a next generated test pattern based on the selected test pattern and the current generated pattern;
    storing the next generated test pattern.

16. The method of claim 15 further comprising:
    incrementing the lane counter;
    selecting the selected test pattern based on the lane counter,
    preparing the pattern seed based on the selected test pattern;
    generating the current generated pattern based on the selected test pattern and the next generated test pattern;
    evaluating whether to transmit the current generated pattern or a header based on the lane, the evaluating based on the lane counter;
    transmitting either the current generated pattern or the header based on the evaluating.

17. The method of claim 16 wherein the evaluating comprises selecting the header when a value of the lane counter corresponds to a deskew lane, and selecting the current generated pattern when a value of the lane counter corresponds to a data lane.

18. A method for receiving test data according to a physical layer communications standard comprising:
    starting a lane counter;
    receiving incoming data;
    synchronizing the incoming data;
    selecting a test pattern based on a value of the lane counter;
    evaluating whether to use the incoming data or a stored next generated pattern to generate an anticipated pattern;
    generating an anticipated pattern based on the evaluating and the test pattern;
    comparing the generated anticipated pattern with the incoming data;
    flagging an error condition if the generated anticipated pattern and the incoming data do match based on the comparing.

19. The method of claim 18 further comprising:
generating the next pattern based on the test pattern and the anticipated generated pattern;
storing the next generated pattern as a stored next generated pattern;
incrementing the lane counter.

20. A transmitter circuit to transmit deskew data conforming to a physical layer communications standard, the transmitter circuit comprising:
a lane counter coupled to a pattern select unit a pattern seed unit, and a current pattern unit, the lane counter to provide a lane value from 0 to 16 and to increment the lane value;
the pattern select unit to select a pattern based on the lane value and to provide a selected pattern to the pattern seed unit, a current pattern generation unit and a next pattern generation unit;
the current pattern unit to store a next generated pattern generated by the next pattern generation unit as a stored current pattern, and to receive the lane value from the lane counter;
the pattern seed unit to provide a pattern seed to a first mux based on the selected pattern and the lane value;
the first mux to select between the pattern seed received from the pattern seed unit and the stored current pattern received from the current pattern unit, and to provide input to the current pattern generation unit;
the current pattern unit to generate a current generated pattern based on input received from the first mux and the selected pattern;
the next pattern generation unit to generate the next generated pattern based on the current generated pattern and the selected pattern;
a second mux to select between transmitting a header or the current generated pattern based on the lane value.

21. A receiver circuit to receive deskew data transmitted according to a physical layer communications standard, the receiver circuit comprising:
a receive line to receive incoming data, the receive line coupled to a frame synchronization unit and a compare unit;
the frame synchronization unit to identify a data location in the incoming data, and to provide the data location to a lane counter and a pattern state machine;
the lane counter to provide a lane value in the range from 0 to 16 and to increment the lane value, the lane counter to provide the lane value to a pattern select unit, a current pattern unit, and the pattern state machine;
the pattern select unit to select a selected pattern based on the lane value and to provide the selected pattern to an anticipated pattern generation unit and a next pattern generation unit;
the current pattern unit to receive a next generated pattern from the next pattern generation unit and store the next generated pattern as a current pattern, the current pattern unit to provide the current pattern to a mux based on the lane value;
the mux to select between the current pattern and the incoming data based on an output from the pattern state machine, and to provide either the current pattern or the incoming data to the anticipated pattern generation unit as a mux selection;
the anticipated pattern generation unit to receive the mux selection from the mux and to generate an anticipated generated pattern based on the mux selection;
the compare unit to evaluate whether the incoming data corresponds to the anticipated generated pattern, and to provide a result and the incoming data to the pattern state machine.

* * * * *